United States Patent
Pham et al.

(10) Patent No.: US 6,242,306 B1
(45) Date of Patent: Jun. 5, 2001

(54) DUAL BIT ISOLATION SCHEME FOR FLASH MEMORY DEVICES HAVING POLYSILICON FLOATING GATES

(75) Inventors: Tuan Pham, San Jose; Angela T. Hui, Fremont, both of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/627,565

(22) Filed: Jul. 28, 2000

(51) Int. Cl.[7] ............................................... H01L 21/8247
(52) U.S. Cl. ............................................ 438/262; 438/257
(58) Field of Search ..................................... 438/257–267

(56) References Cited

U.S. PATENT DOCUMENTS

| | | |
|---|---|---|
| 5,011,787 * | 4/1991 | Jeuch . |
| 5,021,999 | 6/1991 | Kohda et al. . |
| 5,414,693 | 5/1995 | Ma et al. . |
| 5,939,750 | 8/1999 | Early . |

OTHER PUBLICATIONS

U.S. Provisional patent application Serial No. 60/228,711: "Process for Making a Dual Bit Memory Device With Isolated Polysilicon Floating Gates"; Inventors: Jusuke Ogura, Kiyoshi Izumi, Masaru Yano, Hideki Komori, Tuan Pham and Angela Hui; Filed: Aug. 29, 2000; Attorney Docket No. 9076/477.

U.S. Provisional patent application Serial No. 60/228,712: "Dual Bit Memory Device With Isolated Polysilicon Floating Gates"; Inventor: Jusuke Ogura, Masaru Yano, Kazuhiro Kurihara, Hideki Komori, Tuam Pham and Angela Hui; Filed: Aug. 29, 2000; Attorney Docket No. 9076/482.

* cited by examiner

*Primary Examiner*—Richard Booth
(74) *Attorney, Agent, or Firm*—Brinks Hofer Gilson & Lione

(57) ABSTRACT

The present invention relates generally to semiconductor memory devices and more particularly to multi-bit flash electrically erasable programmable read only memory (EEPROM) devices that employ charge trapping within a floating gate to indicate a 0 or 1 bit state. A memory device is provided, according to an aspect of the invention, comprising a floating gate transistor having dual polysilicon floating gates with an isolation opening between floating gates. Processes for making the memory device according to the invention are also disclosed.

17 Claims, 3 Drawing Sheets

DUAL BIT ISOLATION SCHEME FOR FLASH MEMORY DEVICES HAVING POLYSILICON FLOATING GATES

BACKGROUND

Non-volatile semiconductor memory devices are currently in widespread use in electronic components that require the retention of information when electrical power is terminated. Non-volatile semiconductor memory devices include read only memory (ROM), programmable read only memory (PROM), erasable programmable read only memory (EPROM), and electrically erasable programmable read only memory (EEPROM) devices. EEPROM devices differ from other non-volatile semiconductor memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value.

The threshold level of the enhancement transistor controls current flow through the transistor by application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state. This feature is identical to FET operation, except the floating gate in an EEPROM FET alters the threshold voltage dependent upon the presence of charge within the floating gate.

One type of EEPROM device utilizes a polycrystalline silicon or metal layer for the floating-gate electrode. Electrons are transferred to the floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode.

The EEPROM device is programmed by applying a high positive voltage to the control-gate electrode, and a lower positive voltage to the drain region, which transfers electrons from the channel region to the floating-gate electrode. The EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Another type of EEPROM device utilizes an oxide-nitride-oxide (ONO) layer for the fabrication of the floating-gate electrode. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer.

Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile semiconductor memory designers have taken advantage of the localized nature of electron storage within a silicon nitride layer and have designed memory circuits that utilize two regions of stored charge within the ONO layer. This type of non-volatile semiconductor memory device is known as a two-bit EEPROM.

The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions. The structure and operation of this type of memory device is described in a PCT application having the International Publication Number of WO/07000 entitled "TWO BIT NON-VOLATILE ELECTRICALLY ERASABLE AND PROGRAMMABLE SEMICONDUCTOR MEMORY CELL UTILIZING ASYMMETRICAL CHARGE TRAPPING", the contents of which are fully incorporated herein by reference.

The fabrication of two-bit EEPROM devices utilizing an ONO gate structure presents numerous challenges. For example, it is difficult to fabricate an ONO layer without creating interface states that provide charge leakage paths within the ONO layer. Moreover, the ONO layer has the tendency to retain charge after each erase and program function, which may eventually lead to malfunction of the device. Accordingly, alternatives to ONO type two-bit EEPROM devices are desired to overcome these problems.

SUMMARY

According to an aspect of the invention, a process is provided for making an array of two-bit floating gate transistors for a semiconductor memory device having a silicon wafer substrate with parallel rows of bit-line oxide and a tunnel layer on said silicon wafer substrate. The process comprises depositing a sacrificial layer on said tunnel layer, patterning the sacrificial layer to form isolation spacers between said parallel rows of bit-line oxide, depositing a floating gate polysilicon layer on said silicon wafer, and patterning said floating gate polysilicon layer to form isolation openings upon said rows of bit line oxide. According to a further aspect of the invention, the process further comprises removing said isolation spacers thereby forming isolation openings between said rows of bit-line oxide.

According to a further aspect of the invention, a process is provided for making an array of two-bit floating gate transistors for a semiconductor memory device is provided. The process includes providing a silicon wafer substrate having parallel rows of bit-line oxide, depositing a tunnel layer on the silicon wafer substrate, and depositing a sacrificial layer on the tunnel layer. The process further includes forming isolation spacers centered between the parallel rows of bit-line oxide by forming a first mask on the sacrificial layer, removing the first mask except leaving portions of the first mask over areas of the sacrificial layer where the isolation spacers are to be formed, removing the sacrificial layer from areas where the first mask is removed and leaving the sacrificial layer beneath the portions of the first mask that remain, and removing the portions of the first mask and leaving the isolation spacers on the silicon wafer substrate. A floating gate polysilicon layer is then deposited on the silicon wafer substrate to a thickness, and the isolation spacers are exposed by reducing the thickness. Adjacent isolated floating gates are then formed from the polysilicon floating gate layer by forming a second mask on the polysilicon floating gate layer, forming openings in the second mask layer centered upon the rows of bit-line oxide, and removing the polysilicon layer within the openings. Finally, the process includes removing the isolation spacers thereby forming isolation openings between the rows of bit-line oxide, removing the tunnel layer from within the isolation openings, and depositing a barrier layer on the substrate overlying the polysilicon floating gates.

According to a further aspect of the invention, the process includes exposing the isolation spacers is by reducing the thickness is chemical mechanical polishing and planarizing the polysilicon floating gate layer.

According to a further aspect of the invention, the process includes depositing the polysilicon floating gate layer to a thickness such that the polysilicon floating gate layer has a planar surface, and the exposing the isolation spacers by reducing the thickness is etching the polysilicon floating gate layer.

DETAILED DESCRIPTION

Figure 1:
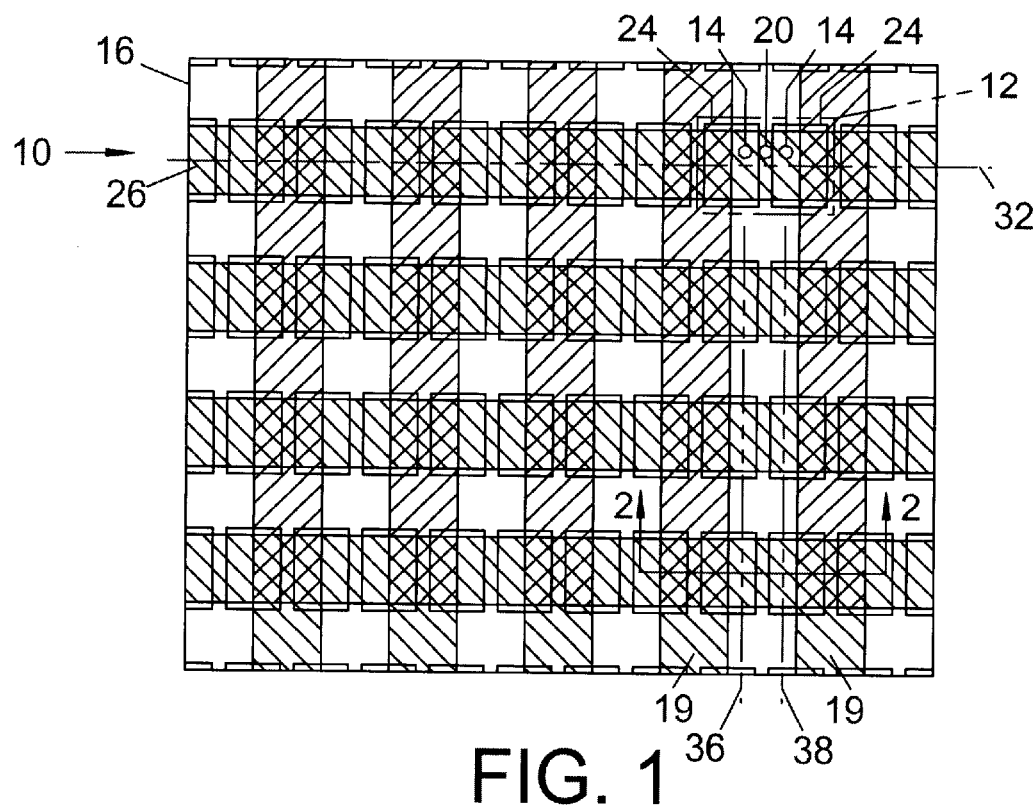
FIG. 1 illustrates, in a portion of a semiconductor substrate containing an array of dual polysilicon floating-gate two-bit transistors in accordance with the invention.

Various aspects of the invention are presented in FIGS. 1–11, which are not drawn to scale, and wherein like components in the numerous views are numbered alike. Although the following description is described with respect to fabricating a two-bit EEPROM device, it will be recognized by those skilled in the art that the following description can be applied to fabricating any non-volatile semiconductor memory device, such as a one-bit EEPROM device. Referring now to FIG. 1 a portion of a ROM memory device 10 showing, in schematic plan view, an array of floating-gate transistors 12 (a single transistor 12 indicated in phantom) formed upon a single crystal silicon substrate 16. The columns of the array are defined by right and left bit-lines 36 and 38 between parallel rows of bit-line oxide 19. The bit-lines 36 and 38 comprise a multitude of doped source/drain regions 14 disposed beneath floating gates 24 on opposite sides of a doped common channel region 20. The source/drain region 14 and channel regions 20 are doped with N type and P type atoms in a manner well known in the art that need not be explained in detail here, other than to say that the doping creates a multitude of transistors suitable for use in a ROM. Each floating-gate transistor 12 comprises such regions.

The rows of the matrix are comprised of wordlines 32 formed by parallel control gates 26, which extend transversely or perpendicular to the direction of the bit-lines 36 and 38. The floating-gates 24 are located beneath the control gates 26 (i.e., along the wordlines 32). As will be explained in detail below, each floating-gate transistor 12 is accessed by addressing the appropriate wordline 32 and bit-lines 36 and 38.

Figure 2:
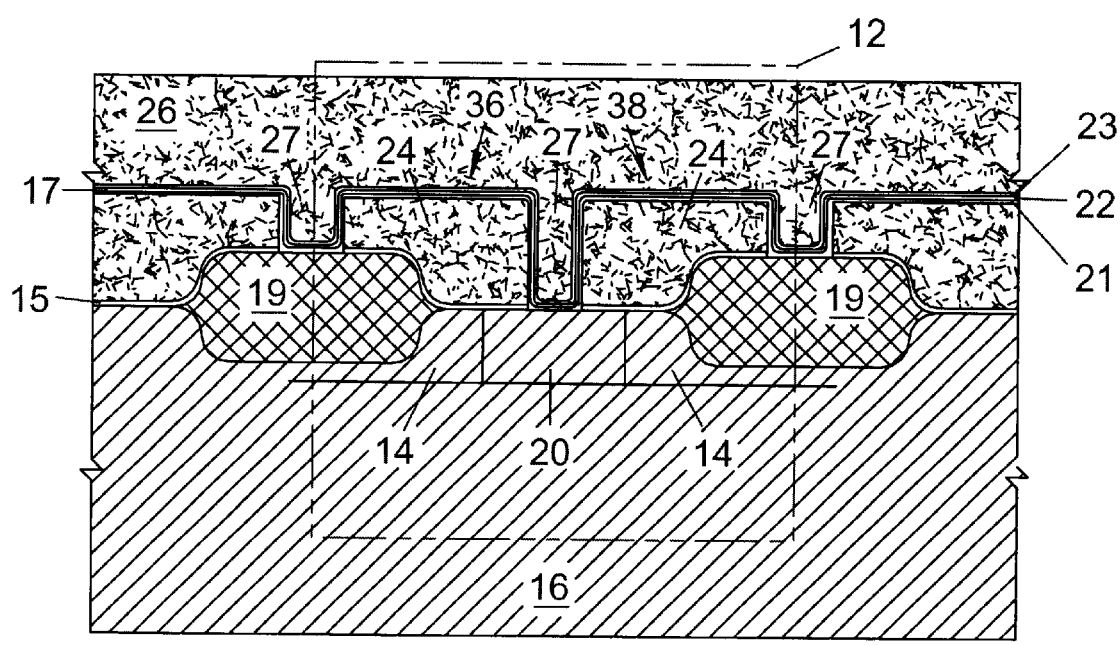
FIG. 2 illustrates, in cross-section, a portion of a semiconductor substrate containing a dual polysilicon floating-gate two-bit transistor in accordance with the invention.

Referring now to FIG. 2, a cross sectional view of the ROM memory device 10 is presented taken along line 2—2 of FIG. 1. Elements previously discussed in relation to FIG. 1 are presented in FIG. 2. The channel region 20 is located between each pair of adjacent source/drain regions 14 just below the floating gates 24. As will be explained in greater detail below in connection with the operation of the floating-gate transistor 12, the channel region 20 is the area through which charge carriers (electrons or holes) travel in response to a potential applied to or across a pair of source/drain regions 14. The floating gates 24 are comprised of polysilicon (polycrystalline silicon), and are between the rows of bit-line oxide. The floating gates 24 may partially overlay the bit-line oxide 19, the channel 20, and/or source/drain regions 14.

According to an aspect of the invention, each transistor 12 comprises dual floating gates 24 separated by an isolation opening 27 and floating gates 24 of adjacent transistors 12 are also separated by isolation openings 27. The polysilicon floating gates 24 are insulated from the substrate 16 by a tunnel layer 15 disposed between the two. The polysilicon floating gates 24 are insulated from the polysilicon control gate 26 by a barrier layer 17 disposed between the two. The tunnel layer 15 and the barrier layer 17 may comprise silicon nitride, silicon dioxide, silicon oxide nitride, and similar materials. One or both of the tunnel layer 15 and barrier layer 17 may be an ONO layer that comprises a first silicon dioxide layer 21 on the substrate 16, a silicon nitride layer 22 on the first silicon dioxide layer 21, and a second silicon dioxide layer 23 on the silicon nitride layer 22. According to a preferred embodiment, the tunnel layer 15 is silicon dioxide.

It should also be noted that the dual floating-gate transistor 12 of the present invention is a symmetrical device. Therefore, the use of the terms "source" and "drain," as they are commonly used with conventional transistor devices, may be confusing. For example, each dual floating-gate transistor 12 comprises a pair of adjacent source/drain regions 14. During program, erase and read functions, one of these two source/drain regions 14 will serve as a source, while the other will serve as a drain.

In conventional transistor terminology, electrons travel from the source to the drain. Which source/drain region 14 functions as a source, and which serves as a drain, depends on the function being performed and on the floating-gate 24 being addressed (i.e., programmed, erased or read).

To avoid confusion, the various components may be referred to as "left" and "right" in the orientation as they appear in the drawings. For example, the source/drain regions 14 and the floating gate 24 corresponding to the left bit-line 36 will be referred to as the left source/drain region 14 and the left floating gate 24. The source/drain region 14 and the floating gate 24 corresponding to the right bit-line 38 will be designated as the right source/drain region 14 and the right floating gate 24. In doing so, it is not intended to limit the invention to any particular orientation, since the terms left and right are used merely to indicate relative position.

The dual floating-gate transistor 12 of the present invention is capable of storing two bits of information, one bit in each floating-gate 24. Programming and reading each of the floating-gates 24, however, requires asymmetrical operation. In particular, programming in one direction (e.g., left to right) will program the right floating-gate 24. Programming in the other direction (e.g., right to left) will program the left floating-gate 24. Likewise, which floating-gate 24 is read depends on which direction the read operation is performed. Which of a pair of source/drain regions 14 is utilized as a "source" and which is utilized as a "drain" determines the direction of programming and reading.

To program the right floating-gate 24, the left source/drain 14 is grounded and program voltages are applied to the control gate 26 and the right source/drain 38 to create lateral and vertical electric fields. Under conventional transistor terminology, the left source/drain 14 is considered the "source" and the right source/drain 14 is considered the "drain." The lateral electric field causes electric charge (i.e., electrons) to propagate across the channel region 20 from the left source/drain 14 towards the right source/drain 14. Once the charge gains enough energy and encounters a sufficiently strong vertical field, the charge is either injected (Channel Hot Electron injection) or tunnels (Fowler-Nordheim tunneling) from channel region 20 across the tunnel layer 15 and into the right floating-gate 42. Suitable "program voltages" to accomplish this are well known in the art. The electrons are held within the floating gates by the tunnel layer 15 and the barrier layer 17.

A similar method is used to program the left floating-gate 24. However, the "source" and the "drain" are reversed. In other words, the right source/drain 14 is grounded and program voltages are applied to the control gate 26 and the left source/drain 14. Under conventional transistor terminology, the left source/drain 14 is considered the "drain" and the right source/drain 14 is considered the "source." The lateral and vertical fields generated cause electric charge to move towards the left source/drain 14 and subsequently into the left floating-gate 24.

The floating gates 24 are read in the direction opposite to programming. For example, the right floating-gate 24 is read by grounding the right source/drain and applying read voltages to the control gate 26 and the left source/drain 14. Under conventional transistor terminology, the left source/drain 14 is considered the "drain" and the right source/drain 14 is considered the "source." A transistor 12 having a programmed floating gate 24 has a higher threshold voltage than a transistor 12 having an unprogrammed floating gate 24. The voltage applied to the control gate 26 for reading is greater than the threshold voltage of an unprogrammed transistor 12, but less than the threshold voltage of a programmed transistor 12.

When reading a particular floating gate 24, in this case the right one, a transistor 12 having a programmed floating gate 24 conducts current, and a transistor 12 having an unprogrammed floating gate 24 does not conduct current. This property reflects the 0 and 1 bit states, respectively. In this example, the right floating gate 24 determines the threshold voltage, thus corresponding to the right bit in transistor 12. Suitable "read voltages" are well known in the art.

A similar method is used to read the left floating-gate 24. However, the "source" and the "drain" are reversed. In other words, the left source/drain 14 is grounded and read voltages are applied to the right source/drain 14 and the control gate 26. Under conventional transistor terminology, the left source/drain 14 is considered the "source" and the right source/drain is considered the "drain." As described above, the flow of current through the dual floating-gate transistor 12 depends on whether the left floating-gate 24 is programmed or not. In this example, the left floating gate 24 determines the threshold voltage, thus corresponding to the left bit in transistor 12.

It should be understood that the dual floating-gate transistor 12 of the present invention permits the status of one floating-gate 24 to be determined irrespective of the status of the other floating-gate 24. In other words, the programmed state of one of the floating-gates 24 will not effect the ability to read the other floating-gate 24.

The dual floating-gate transistor 12 is typically erased by simultaneously applying erase voltages to the source/drain regions 14 and the control gate 26 that generate electric fields that pull the trapped electrons out of the floating gate 24 into the corresponding source/drain 14. For example, a negative voltage may be applied to the control gate 26 and a positive voltage to the source/drain regions 14 so as to cause electron tunneling to occur from the floating-gates 24 to the source/drain regions 14. Suitable erase voltages are well known in the art.

Programming, reading, and erasing the bits in the dual-bit transistor 12 is performed using support logic circuits disposed outside of the memory array. The configuration of the support logic circuits depends upon the desired parameters for a particular application according to circuit design and fabrication practices known in the art.

According to a further aspect of the invention, a process for making an array of two-bit floating gate transistors 12 for a semiconductor memory device 10 is provided. Still referring to FIGS. 1 and 2, an array of two-bit floating gate transistors 12 is formed having polysilicon floating gates 24 partially overlying parallel rows of bit-line oxide 19. Isolation openings 27 are formed between the parallel rows of bit-line oxide 19 that divide the floating gates 24. Additional isolation openings 27 may also be formed centered over the rows of bit-line oxide 19 that divide the floating gates 24. According to a further aspect of the invention, the semiconductor memory device 10 may be incorporated into an electronic device, such as a computer, without limitation.

Figure 3:
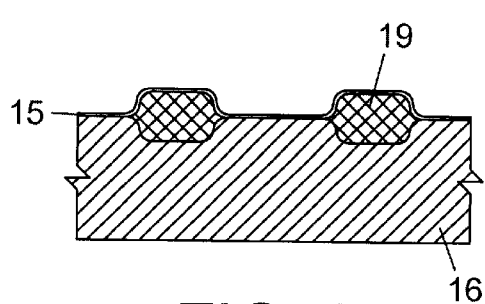
FIG. 3 illustrates a cross-sectional view of a stage of a process for making a two bit memory device according to an aspect of the invention.

Referring now to FIGS. 3–11, a process for making a semiconductor device 10 according to a further aspect of the invention is presented. Referring now specifically to FIG. 3, a silicon wafer substrate 16 is provided having parallel rows of bit-line oxide 19. The tunnel layer 15 is deposited on the silicon wafer substrate 16. The tunnel layer 15 may be chosen from a group consisting of silicon nitride, silicon dioxide, and silicon oxide nitride. As mentioned previously, the tunnel layer may be ONO. According to a preferred embodiment, the tunnel layer 15 is silicon dioxide.

Figure 4:
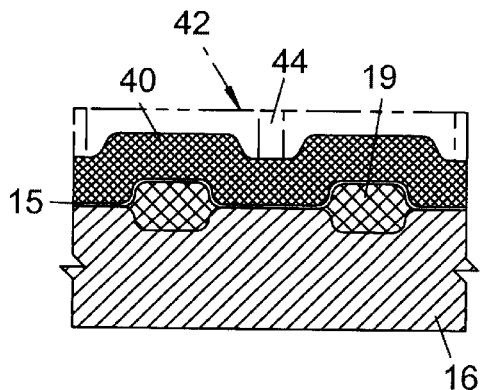
FIG. 4 illustrates a cross-sectional view of a subsequent stage of the process.

Referring now to FIG. 4, a sacrificial layer 40 is deposited on the substrate 16 overlying the tunnel layer 15. The sacrificial layer 40 may may be any material suitable for such use, and be chosen from a group consisting of silicon nitride, silicon dioxide, and silicon oxide nitride.

The next step in the process is to form isolation spacers 25 centered between the parallel rows of bit-line oxide 19 from the sacrificial layer 40. Still referring to FIG. 4, a first mask 42 (shown in phantom) is formed on the sacrificial layer 40. The first mask 42 is then removed except portions 44 of the first mask 42 are left over areas of the sacrificial layer 40 where the isolation spacers 25 are to be formed. Suitable masking techniques and materials are known in art, for example photolithography of photoresist and removal of unwanted photoresist by solvents. It is not intended to limit the invention to any particular masking technique or material.

Figure 5:
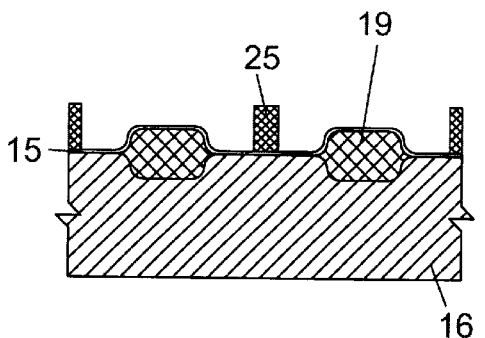
FIG. 5 illustrates a cross-sectional view of a subsequent stage of the process.

Referring now to FIG. 5, the sacrificial layer 40 is then removed from areas where the first mask was removed using dry or wet etching processes known in the art. The remaining portions 44 of the first mask 42 shields the sacrificial layer 40, thus leaving the sacrificial layer 40 beneath the portions 44 of the first mask 42 that remain. The remaining portions 44 of the first mask 42 are removed, thus leaving the isolation spacers 25 on the silicon wafer substrate 16.

Figure 6:
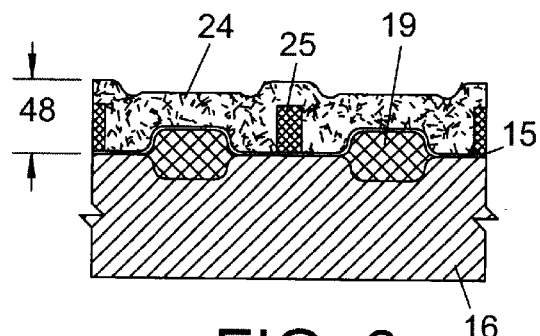
FIG. 6 illustrates a cross-sectional view of a subsequent stage of the process.
Figure 7:
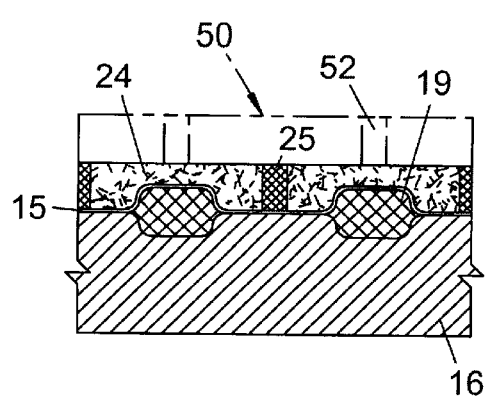
FIG. 7 illustrates a cross-sectional view of a subsequent stage of the process.

Referring now to FIG. 6, the polysilicon floating gate layer 24 is then deposited on the silicon wafer substrate 16 to thickness 48. Referring now to FIG. 7, the isolation spacers 25 are exposed by reducing the thickness 48. The isolation spacers 25 may be exposed by reducing the thickness 48 by chemical mechanical polishing, which also planarizes the polysilicon floating gate layer 24. According to an alternative embodiment, the polysilicon floating gate layer 24 is deposited to a thickness such that the polysilicon floating gate layer 24 has a planar surface. The surface is then dry or wetch etched thereby exposing the isolation spacers 25 by reducing the thickness 48.

Figure 8:
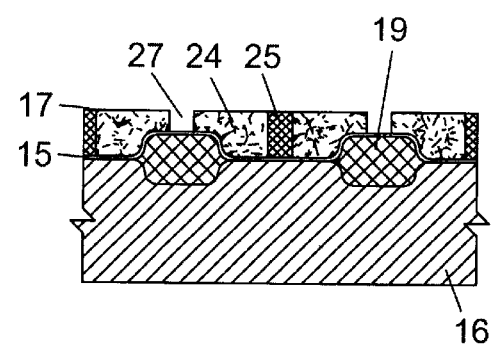
FIG. 8 illustrates a cross-sectional view of a subsequent stage of the process.

Referring now to FIGS. 7 and 8, adjacent isolated floating gates 24 corresponding to adjacent dual bit floating gate transistors 12 are formed from the polysilicon floating gate layer 24 by forming a second mask 50 (shown in phantom) on the polysilicon floating gate layer 24, forming openings 52 in the second mask layer 50 centered upon the rows of bit-line oxide 19, and removing the polysilicon floating gate layer 24 within the openings 52, thus forming the isolation openings 27 centered over the bit-lines 19.

Figure 9:
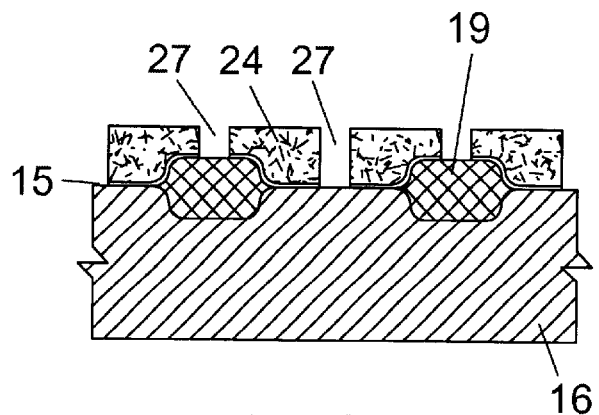
FIG. 9 illustrates a cross-sectional view of a subsequent stage of the process.

Referring now to FIG. 9, the isolation spacer 25 is removed by etching, thereby creating another isolation spacer 27 between the parallel rows of bit-line oxide 19. The tunnel layer 15 exposed within the isolation openings 27 is removed by an etching process as a continuation of the just mentioned etching process with the same etchant, or by an additional etching process using a different etchant. An isolation spacer 25 that is formed from silicon nitride is preferably removed by etching with hot phosphoric acid. A tunnel layer 15 formed from silicon dioxide is preferably removed by etching with hydrofluoric acid or a buffered oxide etch, according to methods known in the art. The etching process stops on the silicon substrate 16 and bit-line oxide 19 within the isolation openings 27.

Figure 10:
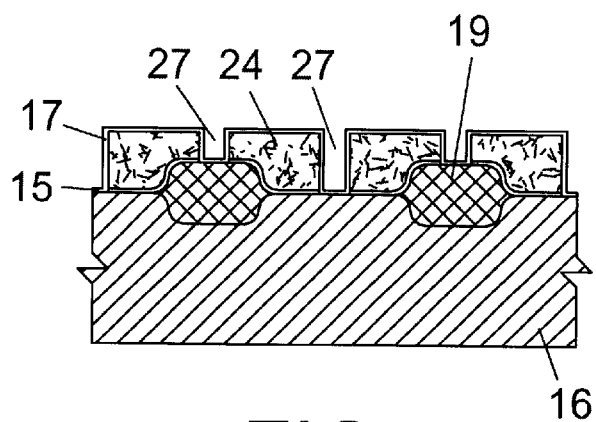
FIG. 10 illustrates a cross-sectional view of a subsequent stage of the process; and, FIG. 11 illustrates a cross-sectional view of a subsequent stage of the process.
Figure 11:
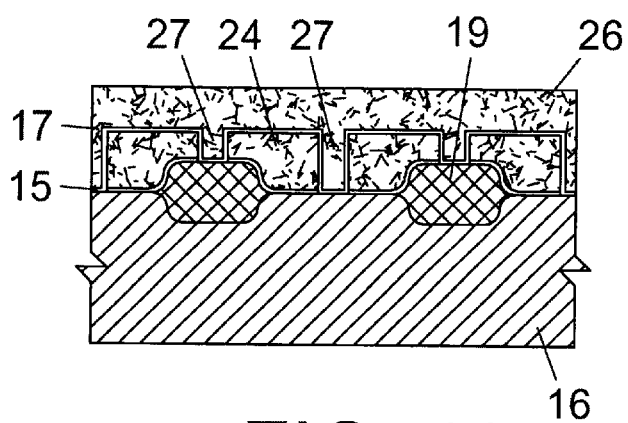

Referring now to FIG. 10, a barrier layer 17 is then deposited. The barrier layer 17 may be chosen from a group consisting of silicon nitride, silicon dioxide, and silicon oxide nitride. As mentioned previously, the barrier layer 17 may be ONO. As presented in FIG. 11, another polysilicon layer may then be deposited to form the control gate 26.

A process for making a semiconductor device 10 having an array of two-bit floating gate transistors 12 is also provided. A silicon wafer substrate 16 is provided having parallel rows of bit-line oxide 19. The tunnel layer is deposited on the silicon wafer substrate 16. A multitude of adjacent isolated polysilicon floating gates 24 are formed, arranged such that each two-bit floating gate transistor 12 has two of the isolated floating gates 24, one for each bit, using the processes described in relation to FIGS. 3–11.

According to a further aspect of the invention, a semiconductor memory device 10 is provided made by any of the processes of the invention. According to a further aspect of the invention, a computer is provided comprising the semiconductor memory device 10 made by the processes of the invention. The semiconductor memory device 10 may be a flash EEPROM.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A process for making a non-volatile semiconductor memory device having a silicon wafer substrate with parallel rows of bit-line oxide and a tunnel layer on said silicon wafer substrate, the process comprising:

depositing a sacrificial layer on said tunnel layer;

patterning the sacrificial layer to form isolation spacers between said parallel rows of bit-line oxide;

depositing a floating gate polysilicon layer on said silicon wafer after patterning said sacrificial layer; and patterning said floating gate polysilicon layer to form isolation openings upon said rows of bit line oxide.

2. The process of claim 1, further comprising removing said isolation spacers thereby forming isolation openings between said rows of bit-line oxide.

3. The process of claim 2, further comprising depositing a barrier layer on said substrate overlying said polysilicon floating gates.

4. The process of claim 3, further comprising depositing a polysilicon control gate layer.

5. A process for making a non-volatile semiconductor memory device, comprising:

(a) providing a silicon wafer substrate having parallel rows of bit-line oxide;

(b) depositing a tunnel layer on said silicon wafer substrate;

(c) depositing a sacrificial layer on said tunnel layer;

(d) forming isolation spacers centered between said parallel rows of bit-line oxide by forming a first mask on said sacrificial layer, removing said first mask except leaving portions of said first mask over areas of said sacrificial layer where said isolation spacers are to be formed, removing said sacrificial layer from areas where said first mask is removed and leaving said sacrificial layer beneath said portions of said first mask that remain, and removing said portions of said first mask and leaving said isolation spacers on said silicon wafer substrate;

(e) depositing a floating gate polysilicon layer on said silicon wafer substrate to a thickness;

(f) exposing said isolation spacers by reducing said thickness;

(g) forming adjacent isolated floating gates from said polysilicon floating gate layer by
forming a second mask on said polysilicon floating gate layer,
forming openings in said second mask layer centered upon said rows of bit-line oxide, and
removing said polysilicon layer within said openings;

(h) removing said isolation spacers thereby forming isolation openings between said rows of bit-line oxide;

(i) removing said tunnel layer from within said isolation openings; and, (j) depositing a barrier layer on said substrate overlying said polysilicon floating gates.

6. The process of claim 5, wherein said exposing said isolation spacers by reducing said thickness is chemical mechanical polishing and planarizing said polysilicon floating gate layer.

7. The process of claim 5, wherein:
depositing said polysilicon floating gate layer to a thickness is depositing said polysilicon floating gate layer to a thickness such that said polysilicon floating gate layer has a planar surface; and
said exposing said isolation spacers by reducing said thickness is etching said polysilicon floating gate layer.

8. The process of claim 5, wherein depositing said tunnel layer is depositing a silicon dioxide layer on said silicon wafer substrate.

9. The process of claim 5, wherein depositing said barrier layer is depositing an ONO layer on said silicon wafer substrate overlying said polysilicon floating gates.

10. The process of claim 5, further comprising the step of depositing a polysilicon control gate layer.

11. The process of claim 5, wherein said first mask is photoresist.

12. The process of claim 5, wherein said second mask is photoresist.

13. The process of claim 5, wherein said sacrificial layer is chosen from a group consisting of silicon nitride, silicon dioxide, and silicon oxide nitride.

14. The process of claim 5, wherein said tunnel layer and said barrier layer are chosen from a group consisting of silicon nitride, silicon dioxide, and silicon oxide nitride.

15. A process for making a non-volatile semiconductor device having an array of floating gate transistors, comprising the steps of:

(a) providing a silicon wafer substrate having parallel rows of bit-line oxide;

(b) depositing a sacrificial layer on said tunnel layer; and, (c) forming a multitude of adjacent isolated polysilicon floating gates arranged such that each two-bit floating gate transistor has two of said isolated polysilicon floating gates, one for each bit, comprising
(1) depositing a tunnel layer on said silicon wafer substrate,
(2) forming isolation spacers centered between said parallel rows of bit-line oxide by
depositing a sacrificial layer on said tunnel layer,
forming a first mask on said sacrificial layer,
removing portions of said first mask except over areas of said sacrificial layer where said isolation spacers are to be formed,
removing said sacrificial layer from areas where said first mask is removed and leaving said sacrificial layer beneath said portions of said first mask that remain, and
removing said portions of said first mask and leaving said isolation spacers on said silicon wafer substrate,
(3) depositing a floating gate polysilicon layer on said silicon wafer substrate to a thickness,
(4) exposing said isolation spacers by reducing said thickness,
(5) forming said adjacent isolated polysilicon floating gates from said polysilicon floating gate layer by
forming a second mask on said polysilicon floating gate layer,
forming openings in said second mask layer centered upon said rows of bit-line oxide, and
removing said polysilicon layer within said openings;
(6) removing said isolation spacers thereby forming isolation openings between said rows of bit-line oxide;
(7) removing said tunnel layer from within said isolation openings; and,
(8) depositing a barrier layer on said substrate overlying said polysilicon floating gates.

16. The process of claim 15, wherein said tunnel layer and said barrier layer are chosen from a group consisting of silicon nitride, silicon dioxide, and silicon oxide nitride.

17. The process of claim 15, further comprising the step of incorporating said semiconductor memory device into an electronic device.

* * * * *